United States Patent [19]
Bladon

[11] Patent Number: 5,276,290
[45] Date of Patent: Jan. 4, 1994

[54] ELECTROPLATING PROCESS AND COMPOSITION

[75] Inventor: John J. Bladon, Wayland, Mass.

[73] Assignee: Shipley Company Inc., Marlborough, Mass.

[21] Appl. No.: 943,067

[22] Filed: Sep. 10, 1992

Related U.S. Application Data

[62] Division of Ser. No. 719,978, Jun. 24, 1991.

[51] Int. Cl.$^5$ .................................................. H05K 1/00
[52] U.S. Cl. ......................................... 174/262; 174/266; 174/257
[58] Field of Search ............... 174/262, 264, 266, 256, 174/257, 258; 428/96, 97, 98

[56] References Cited

U.S. PATENT DOCUMENTS

| | | | |
|---|---|---|---|
| 844,304 | 2/1907 | Daly | 156/659.1 X |
| 2,474,502 | 6/1949 | Suchy | 204/20 X |
| 3,011,920 | 12/1961 | Shipley | 427/98 |
| 3,934,335 | 1/1976 | Nelson | 174/266 X |
| 4,303,798 | 12/1981 | Paunovic | 174/266 X |
| 4,325,780 | 4/1982 | Schulz, Sr. | 174/266 X |
| 4,919,768 | 4/1990 | Bladon | |
| 5,007,990 | 4/1991 | Bladon | 204/20 |
| 5,017,742 | 5/1991 | Bladon | 174/266 |

FOREIGN PATENT DOCUMENTS 0298298  1/1989  European Pat. Off.

Primary Examiner—Leo P. Picard
Assistant Examiner—Cheryl R. Figlin
Attorney, Agent, or Firm—Robert L. Goldberg

[57] ABSTRACT

A process for electroplating a nonconducting substrate comprising formation of a catalytic metal sulfide on the surface of a nonconducting substrate and electrolytic deposition of metal thereover. The catalytic metal chalcogenide is preferably palladium sulfide.

4 Claims, 1 Drawing Sheet

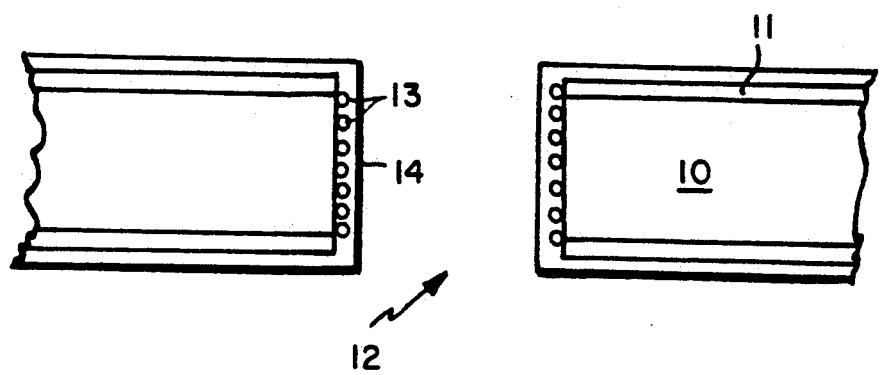

ELECTROPLATING PROCESS AND COMPOSITION

This is a divisional of copending application Ser. No. 07/719,978 filed on Jun. 24, 1991.

BACKGROUND OF THE INVENTION

1. Introduction

This invention relates to electroplating nonconductors, and more particularly, to processes and compositions for electroplating the surface of a nonconductor using a preformed colloid of a metal chalcogenide that, when absorbed onto a nonconducting surface, functions as a base for direct electroplating. The invention is especially useful in the manufacture of printed circuit boards.

2. Description of the Prior Art

Nonconductor surfaces are conventionally metallized by a sequence of steps comprising catalysis of the surface of the nonconductor to render the same catalytic to electroless metal deposition followed by contact of the catalyzed surface with an electroless plating solution that deposits metal over the catalyzed surface in the absence of an external source of electricity. Metal plating continues for a time sufficient to form a metal deposit of the desired thickness. Following electroless metal deposition, the electroless metal deposit is optionally enhanced by electrodeposition of a metal over the electroless metal coating to a desired thickness. Electrolytic deposition is possible because the electroless metal deposit serves as a conductive coating that permits electroplating.

Catalyst compositions useful for electroless metal plating are known in the art and disclosed in numerous publications including U.S. Pat. No. 3,011,920, incorporated herein by reference. The catalyst of this patent consists of an aqueous suspension of a tin - noble or precious (catalytic) metal colloid. Surfaces treated with such catalysts promote the generation of electrolessly formed metal deposits by the oxidation of a reducing agent in an electroless plating solution catalyzed by the catalytic colloid.

Electroless plating solutions are aqueous solutions containing both a dissolved metal and a reducing agent in solution. The presence of the dissolved metal and reducing agent together in solution results in plate out of metal in contact with a catalytic metal tin catalyst. However, the presence of the dissolved metal and reducing agent together in solution can also result in solution instability and indiscriminate deposition of metal on the walls of containers for such plating solutions. This may necessitate interruption of the plating operation, removal of the plating solution from the tank and cleaning of tank walls and bottoms by means of an etching operation. Indiscriminate deposition may be avoided by careful control of the plating solution during use and by use of stabilizers in solution which inhibit indiscriminate deposition, but which also retard plating rate.

Attempts have been made in the past to avoid the use of an electroless plating solution by a direct plating process whereby a metal may be deposited directly over a treated nonconductive surface. One such process is disclosed in U.S. Pat. No. 3,099,608, incorporated herein by reference. The process disclosed in this patent involves treatment of the nonconductive surface with a tin palladium colloid which forms an essentially nonconductive film of colloidal palladium particles over the nonconductive surface. This is the same tin palladium colloid used as a plating catalyst for electroless metal deposition. For reasons not fully understood, it is possible to electroplate directly over the catalyzed surface of the nonconductor from an electroplating solution though deposition occurs by propagation and growth from a conductive surface. Therefore, deposition begins at the interface of a conductive surface and the catalyzed nonconductive surface. The deposit grows epitaxially along the catalyzed surface from this interface. For this reason, metal deposition onto the substrate using this process is slow. Moreover, deposit thicknesses is uneven with the thickest deposit occurring at the interface with the conductive surface and the thinnest deposit occurring at a point most remote from the interface.

An improvement in the process of U.S. Pat. No. 3,099,608 is described in U.K. Patent No. 2,123,036 B, incorporated herein by reference. In accordance with the process described in this patent, a surface is provided with metallic sites and the surface is then electroplated from an electroplating solution containing an additive that is said to inhibit deposition of metal on the metal surface formed by plating without inhibiting deposition on the metallic sites over the nonconductive surface. In this way, there is said to be preferential deposition over the metallic sites with a concomitant increase in the overall plating rate. In accordance with the patent, the metallic sites are preferably formed in the same manner as in the aforesaid U.S. Pat. No. 3,099,608—i.e., by immersion of the nonconductive surface in a solution of a tin palladium colloid. The additive in the electroplating solution responsible for inhibiting deposition is described as one selected from a group of dyes, surfactants, chelating agents, brighteners and leveling agents. Many of such materials are conventional additives for electroplating solutions.

There are limitations to the above process. Both the processes of the U.S. and U.K. patents for electroplating require conductive surfaces for initiation and propagation of the electroplated metal deposit. For this reason, the processes are limited in their application to metal plating solutions of nonconductive substrates in areas in close proximity to a conductive surface.

One commercial application of the process of the U.K. patent is the metallization of the walls of through-holes in the manufacture of double sided printed circuit boards by a process known in the art as panel plating. In this application, the starting material is a printed circuit board substrate clad on both of its surfaces with copper. Holes are drilled through the printed circuit substrate at desired locations. For conductivity, the hole walls are catalyzed with a tin-palladium colloid to form the required metal sites on the walls of the through-holes. Since the circuit board material is clad on both of its surfaces with copper and the circuit board base material is of limited thickness, the copper cladding on the surfaces of the circuit board material is separated by the thin cross section of the substrate material. The next step in the process is direct electroplating over the catalyzed hole walls. Since the copper cladding on each surface is separated by the cross section of the substrate, during electroplating, deposition initiates at the interfaces of the copper cladding and the through-hole walls and rapidly propagates into the holes. The hole wall is plated to a desired thickness within a reasonable period of time. Thereafter, the circuit board is finished by imaging and etching operations.

A disadvantage to the above panel plating process is that copper is electroplated over the hole walls and over the entire surface of the copper cladding. The steps following plating involve imaging with an organic coating to form a circuit pattern and removal of copper by etching. Therefore, copper is first electrolytically deposited and then removed by etching, a sequence of steps which is wasteful of plating metal, etchant and time, and therefore, expensive.

The art, recognizing the disadvantages of panel plating, has developed a method for manufacturing printed circuit boards known as pattern plating. In this process, a printed circuit board base material is drilled at desired locations to form through-holes. Through-holes are metallized using conventional electroless plating techniques. Electroless copper is plated onto the walls of the through-holes and over the copper cladding. Thereafter, photoresists are supplied and imaged to form the circuit pattern. The board is then electroplated with copper depositing on the copper conductors and through-hole walls, but not over the entire surface of the copper cladding. Soldermask is then plated over the exposed copper by immersion or electroplating and the remaining photoresist is stripped. The copper not protected by the solder is then removed by etching to form the copper circuit.

Pattern plating cannot be used with the metallizing process of the aforesaid U.K. patent. The treatment of the copper cladding prior to the application of the photoresist and the development of the photoresist, all as required for pattern plating, requires the use of treatment chemicals found to dissolve or desorb the tin palladium colloid from the hole walls. Since this occurs prior to electroplating, direct electroplating to provide conductor through-holes becomes impossible.

Further improvements on the processes for the direct electroplating of nonconductors are disclosed in U.S. Pat. Nos. 4,895,739; 4,919,768 and 4,952,286, all incorporated herein by reference. In accordance with the processes of these patents, an electroless plating catalyst, such as that disclosed in the aforesaid U.K. patent, is treated with an aqueous solution of a chalcogen, such as a sulfur solution, to convert the catalytic surface to a chalcogenide surface. By conversion of the surface to the chalcogen conversion coating, the electroless plating catalyst does not desorb from the surface during metallization, and consequently, in accordance with the processes of said patents, it is possible to pattern plate substrates in the formation of printed circuit boards.

The processes of the aforementioned patents provide a substantial improvement over the process of the U.K. Patent. However, it has also been found that treatment of an absorbed catalytic metal or over a nonconductor with a solution of a chalcogenide, especially a sulfide solution, results in a formation of a chalcogenide on all metal surfaces in contact with the solution of the chalcogen. Therefore, if the process is used in the manufacture of printed circuit boards, the copper cladding or conductors of the printed circuit board base material are converted to the chalcogenide together with the catalytic metal. If the chalcogenide of the copper is not removed prior to plating, it can reduce the bond strength between the copper and a subsequently deposited metal over the copper.

In addition to the above, the art of printed circuit board manufacture is moving to horizontal processing. Equipment for horizontal processing is by design, more compact than that equipment used for vertical processing and can accommodate fewer treatment solutions. For this reason, printed circuit board manufacturers are trying to shorten the process line—i.e., reduce the number of processing steps and treatment solutions required for the manufacture of printed circuit boards. For this reason, plating sequences employing fewer processing steps are needed.

Definitions

The term "nonconductor" means an article having at least a portion of its surface inadequately conductive for direct electroplating. In the preferred embodiment of the invention, the term "nonconductor" refers to a printed circuit board base material such as a copper clad epoxy or phenolic sheet.

The term "U.K. Patent" means U.K. Patent No. 2,123,036 B.

The term "catalytic metal" means a metal that is catalytic to electroless metal deposition and includes within its scope those precious metals identified in U.S. Pat. No. 2,702,253 incorporated herein by reference.

The term "catalytic metal chalcogenide" means the product resulting from reaction of a chalcogen with a catalytic metal as defined above.

SUMMARY OF THE INVENTION

The subject invention provides a further improvement in processes for electroplating nonconductors using catalytic metal chalcogenides. In accordance with the invention described herein, a stable colloidal solution of a preformed catalytic chalcogenide is prepared and a nonconductor surface is then contacted with the colloidal composition such as by immersion whereby the colloidal chalcogenide absorbs on the surface of the nonconductor. Following absorption of the colloidal chalcogenide, the nonconductor may be electroplated following procedures disclosed in the aforesaid U.S. Pat. Nos. 4,895,739; 4,919,768 and 4,952,286.

The process of the invention is a substantial improvement over the earlier processes for plating nonconductors, especially those having metallic portions thereover, as there are fewer processing steps and metal surfaces do not come into contact with a solution of a chalcogen thus forming a chalcogenide which is desirably removed prior to plating. The reduced number of processing steps results from avoiding the need to separately treat the nonconductor with a colloidal catalytic solution followed by the solution of the chalcogenide and by avoidance of an etch step to remove metal chalcogen formed over metallic surfaces.

The process of the invention is illustrated by the plating sequence for plating through holes in printed circuit formation that follows and is compared to a conventional plating process requiring electroless metal deposition.

|  | Conventional Process |  | Inventive Process |
| --- | --- | --- | --- |
| Step 1 | Desmear with Chromic or sulfonic acid or plasma; | Step 1 | Same; |
| Step 2 | Clean and condition with detergent type cleaner; | Step 2 | Same; |
| Step 3 | Microetch copper cladding; | Step 3 | Immerse in preformed solution of catalytic chalcogenide; |
| Step 4 | Catalyst predip; | Step 4 | Microetch copper cladding |
| Step 5 | Catalyze with catalytic colloid; | Step 5 | Electroplate to full thickness. |

| Conventional Process | Inventive Process |
|---|---|
| Step 6 Deposit electroless metal; | |
| Step 7 Electroplate to full thickness. | |

A comparison of the two processes demonstrates that the process of the invention replaces the need for electroless plating with a direct electroplating step thus eliminating the need for a costly electroless metal plating solution and the associated problems of solutions stability and disposal. The elimination of the electroless plating step is accomplished with a decrease in the total number of steps required for metal deposition both compared to the conventional process and the process of the aforesaid U.S. Pat. Nos. 4,895,739; 4,919,768 and 4,952,286. Further, the process of the invention is found to be unaffected by conventional processing chemicals used for metal plating on plastics and formation of printed circuit boards. Finally, the process does not cause chalcogen formation by contact of the solution with a metal on the substrate to be plated such as in circuit formation.

For the formation of printed circuit boards using the process of the invention, it is preferred that an etching step be used subsequent to formation of the absorbed catalytic metal chalcogenide over the surface of the nonconductor. The etching step may use the same etchants as used in a conventional process to clean copper cladding (step 3 of the conventional process illustrated above). It is preferred that the etching step be employed in a step subsequent to absorption of the catalytic metal chalcogenide on the surface of the nonconductor so that the etchant may remove any absorbed colloid on the surface of copper cladding.

The final step in the process of the invention comprises electroplating the absorbed metal chalcogenide on the surface of the nonconductor. This is accomplished using standard electroplating procedures. The procedures of the above referenced U.K. patent are suitable for electroplating the chalcogenide coating described herein.

In accordance with the invention, as described above, pretreatment is with a preformed colloid of a catalytic metal chalcogenide. It should be understood that a portion of the invention is the method used to form a colloid of a catalytic metal chalcogenide that is capable of adsorbing onto a nonconductor. It should be understood that not all catalytic metal chalcogenide colloids will have this capability.

The drawing represents a segment of a circuit board having a through hole therein metallized in accordance with the process of the invention.

DESCRIPTION OF THE PREFERRED EMBODIMENTS

The subject invention is suitable for manufacture of a variety of commercial articles where a metal deposit is desired over the surface of a nonconductor. However, the invention is especially useful for the fabrication of printed circuit boards. For this reason, the description that follows is directed primarily to printed circuit board manufacture.

As aforesaid, the invention described herein involves the use of a preformed colloid of a catalytic chalcogenide that is adsorbed onto the surface of a part to be plated. The preformed colloid of the catalytic metal chalcogenide is desirably prepared in a manner that enhances absorption of the colloid onto the surface of the nonconductor to be plated. Factors that influence adsorption of a colloid onto a substrate are particle size and net charge, the charge being more significant than the particle size. To enhance adsorption of a colloid on a substrate, the colloid should be finely divided and carry a net charge opposite from that of the substrate following conditioning.

To form a finely divided colloid, it is desirable to first homogeneously distribute a salt of a catalytic metal through solution. This is desirably accomplished by dissolving the metal salt in a solution containing a complexing agent for the metal to complex the metal prior to insolubilizing the same. This is most readily accomplished by dissolving the metal salt in an aqueous solution and adding this solution to a solution of the complexing agent. The complexed metal salt content may range from about 0.000001 to 0.05 moles per liter and more preferably ranges in concentration of from about 0.00005 to 0.005 moles per liter. The complexing agent is preferably used in an amount at least equimolar to the metal content of the solution, preferably in a molar excess of from 2 to 1,000 times the metal content of the solution, and more preferably, in a molar excess of from 25 to 400 times the metal content of the solution. Complexing agents for catalytic metals are known in the art. Nitrogen containing complexing agents are preferred for catalytic metals. Most preferred for purposes of the subject invention are compounds with an amine group and a moiety which is negatively charged at the pH at which the soluble chalcogen solution is added. Examples are 2-aminoethyl hydrogen sulfate and amino methane sulfonic acid.

Following formation of the complex metal and its complexing agent, the complexed metal is contacted with a solution soluble chalcogen to form the insoluble chalcogenide. The chalcogen is preferably formed as a separate solution and added to the solution of the complexed metal. The concentration of the chalcogen in solution may range from about 0.2 to 100 times the concentration of the metal, but preferably ranges from about 0.5 to 10 times the concentration of the metal and more preferably ranges from about equimolar with the metal to 2 times the metal content. Prior to the addition of the chalcogen, the pH of the composition is adjusted to the pK favoring colloid formation. Specifically, the palladium must be complexed prior to addition of chalcogen and a negatively charged moiety on the suspending agent must also be present to promote stability of the colloid. For example, the pKs of amino methane sulfonic acid are about 5.5 for the sulfonate group and about 8.0 for the amine group.

A method for forming a colloid of a catalytic metal using a step of complexing the metal prior to formation of the colloid is disclosed in U.S. Pat. No. 4,634,468 incorporated herein by reference except that the reactant used to form the colloid for purposes herein would be a chalcogen such as a sulfide, telluride or selenide. An alkali metal sulfide is most preferred. The reaction is conducted in a manner whereby the mean particle size of colloid preferably does not exceed 1,000 Angstroms and more preferably, does not exceed 500 Angstroms. Other methods for forming such colloids are disclosed by Zsigmondy, *The Chemistry of Colloids,* John Wiley and Sons, Inc. New York, 1917, Chapter 8, pp 176 to 178, incorporated herein by reference.

The net charge of a colloid, as should be known to those skilled in the art, is dependent upon the materials used to form the colloid and pH of the colloidal solution. For purposes of this invention, the colloid should have a charge opposite to the charge of a conditioned substrate prepared for plating. In the manufacture of printed circuit boards, it is conventional to condition the circuit board base material with a conditioner that imparts a charge, typically positive, to the surface of the nonconductor. In this instance, the preformed chalcogenide colloid should carry a net negative charge so as to adsorb onto the surface of the conditioned printed circuit board base material.

The following description illustrates the manner in which the colloid of the catalytic metal chalcogenide may be used in printed circuit board manufacture. For such manufacture, the substrate commonly used is an epoxy substrate filled with glass fibers and copper clad on at least one of its surfaces. As is known in the art, the epoxy may be mixed with other resins for specific purposes.

In the manufacture of a double sided printed circuit board, a first step comprises the formation of throughholes by drilling or punching or any other method known to the art. Following formation of the holes, it is desirable to employ the conventional step of desmearing the holes (step 1 above) using sulfuric acid or chromic acid or by plasma etching or etch back of the holes with chromic acid.

Following desmearing or etch back of the holes, the circuit board base material is conventionally treated with a glass etch that removes glass fibers extending into the holes from the hole walls. This is followed by a solution that cleans the copper surface and conditions the hole wall to promote catalyst absorption. Such solutions are often referred to as cleaner conditioners and typically comprise an aqueous alkaline surfactant solution for cleaning soil and a polyamine or quaternary amine to condition the hole wall and impart a positive charge to facilitate adsorption of a negatively charged colloidal catalyst. This treatment step, by itself, is old in the art and does not constitute a part of the invention. Proprietary cleaner conditioners are commercially available, and a suitable material is available from Shipley Company Inc. of Newton, Mass. and identified as cleaner conditioner 231.

Following the above preparation steps, the processing sequence of the invention may be employed. The next step in the process comprises immersion of the part to be plated in the solution of the preformed colloid of a catalytic metal chalcogenide. The term preformed means that the colloid is formed remote from and out of contact with the nonconductor—i.e., the treatment composition is a stable colloidal solution that is capable of adsorbing on the nonconductor surface. The catalytic metal is one that is capable of catalyzing an electroless metal plating process. The term chalcogenide means a sulfide, telluride or selenide of the catalytic metal. Exemplary catalytic metals are platinum, gold, palladium, nickel and copper. Palladium is most preferred and copper and nickel are least preferred especially as it is difficult to form stable chalcogenide colloids of the same. The preferred chalcogenide is a sulfide. The preferred preformed colloidal catalytic metal chalcogenide is a colloid of palladium sulfide. More preferably, the preferred colloid of a catalytic metal chalcogenide is one that adsorbs onto and adheres to a nonconducting substrate. Methods used to formulate the preferred colloids of the catalytic metal chalcogenide capable of adhering to a substrate are discussed in greater detail below.

The treatment conditions for immersion of a part in the preformed colloid of the catalytic metal chalcogenide are not critical. Preferably, treatment times vary from about 30 seconds to 15 minutes and more preferably, vary between about 2 and 6 minutes. The temperature may vary from room temperature to near the boiling point of the colloidal formulation, but room temperature treatment is preferred.

Treatment with the preformed colloid of the catalytic metal chalcogenide results in the formation of an absorbed layer of the colloid over the nonconductor surface. The adsorbed layer darkens the surface. The coating is suitable for direct electroplating. If the nonconductor is a copper-clad printed circuit base material, the copper cladding should be clean such as, for example, by use of a sulfuric acid - hydrogen peroxide pre-etch. The etchant should be used at room temperature for a period of time ranging between about 1 and 3 minutes. It should be noted that unexpectedly, treatment with the etchant does not result in attack upon the metal chalcogenide absorbed onto the surface of the nonconductor.

The next step in the process of the invention comprises electroplating directly over the absorbed layer of the catalytic metal chalcogenide. The electroplating procedure is similar to the procedure disclosed in the above referenced U.K. Patent, but careful control of the electroplating parameters as required in the U.K. Patent is not necessary in the process of this invention. The electroplating process may use electroplating solutions such as those disclosed in the U.K. Patent, but most commercially available electroplating solutions contain additives which make the same suitable for the process of the invention. The preferred electroplating metals in accordance with the invention are copper and nickel though the process is suitable for electroplating of any desired metal. A typical electroplating solution comprises an aqueous acid solution of the metal desired to be plated together with proprietary additives from the group of dyes, surfactants, chelating agents, brighteners, leveling agents, etc. Typical acids used in the formulation of said baths comprise those with a high ionic dissociation constant for maximum conductivity such as sulfuric acid, fluroboric acid, sulfamic acid, etc. Dyes typically used in such baths include methylene blue, methyl violet, and other n-heterocyclic compounds. Suitable surfactants included in such baths typically include nonionic surfactants such as alkyl phenoxy polyethoxyethanols. Surfactants including wetting agents and water soluble organic compounds such as compounds containing multiple oxyethylene groups have been found to be effective. A preferred group of such compounds include polyoxyethylene polymers having from as many as 20 to 150 repeating units. Also included in this class of materials are block copolymers of polyoxyethylene and polyoxypropylene. The additives described above are added to the solution in conventional concentrations.

The electroplating procedure is conventional. The part to be plated is used as a cathode in a conventional electroplating cell. Current density is conventional and varies typically within a range of from 5 through 40 amps per $ft^2$, depending upon the diameter of holes to be plated, the thickness of the board and the composition of the electroplating solution used. The plating solution is maintained at a temperature ranging between room temperature and about 100° F. Plating is continued for a time sufficient to form a deposit of desired thickness. For circuit board manufacture, a typical thickness may range between 0.5 and 2.0 mils, typically from 1 to 1.5 mils. The plating of from 15 to 90 minutes would typically be required to obtain a deposit of the preferred thickness within the preferred range of current densities. The deposit formed by the process is uniform in thickness, free of defects and strongly bonded to the surface of the nonconductor over which it is plated. Bond strength is satisfactory to withstand soldershock testing as conventionally used in printed circuit board manufacture.

The chemical resistance of an absorbed catalytic metal chalcogenide coating to treatment solutions conventionally used in printed circuit manufacture permit simplified printed circuit board manufacturing processes impractical or inoperative in the prior art. For example, a patent plating sequence, as described above, could not be used with the direct electroplating process of the U.K. patent because the pretreatment steps would remove or dissolve adsorbed colloid thereby making it impossible to first treat and image and then electroplate. This is a serious disadvantage because it severely limits the type of circuit board that can be fabricated using the process of the U.K. patent. The adsorbed chalcogenide colloid of the subject invention remains unaffected when contacted with treatment chemicals required for pattern plating. Therefore, a pattern plating process for formation of a circuit board is possible using the process of the subject invention. Such a process is illustrated in the sequence of steps described below using a predrilled and desmeared copper clad circuit board base material:

|        | Pattern Plating Sequence |
|--------|--------------------------|
| Step 1 | Clean and condition. |
| Step 2 | Treat with chalcogenide colloid. |
| Step 3 | Acid clean copper cladding. |
| Step 4 | Apply and image photoresist. |
| Step 5 | Develop photoresist image. |
| Step 6 | Clean and then microetch copper cladding. |
| Step 7 | Electroplate |
| Step 8 | Apply solder resist. |
| Step 9 | Strip photoresist. |
| Step 10 | Remove copper bared by removal of photoresist. |

Pattern plating is possible in accordance with the invention because the etchants and alkaline developers used to develop the photoresist layer do not adversely affect or inactivate the absorbed chalcogenide colloid. These same materials would inactivate, desorb or dissolve the palladium tin colloidal catalyst used for direct electroplating in the process of the U.K. patent.

The invention will be better understood by reference to the drawing and to the examples which follow where, unless stated otherwise, the substrate treated was an epoxy copper clad circuit board base material provided with a random array of through-holes. In the drawing, there is illustrated a segment of an epoxy circuit board base material with a through hole therein. The epoxy base material 10 is clad on both surfaces with copper cladding 11. The hole is represented by opening 12. The hole wall has a coating of preformed colloidal sulfide particles 13. This is plated with electroplated copper coating 14, which overlies copper cladding 11 and the particulate sulfide 13. Commercial formulations used in the examples are available from Shipley Company Inc. of Newton, Mass.

EXAMPLE 1

Prepare a first hydrochloric acid solution 0.563 molar in palladium chloride. Prepare a second 1.35 molar solution of aminosulfonic acid having a pH of 5.5. Mix 0.2 ml of the first solution with 5 ml of the second solution and 40 ml of deionized water. Adjust the so formed solution to pH about 8 with sodium hydroxide. The mixture turns from yellow to clear as the pH increases. Add 1 ml of an alkaline 0.1 molar solution of sodium sulfide to the so formed solution and adjust the pH to about 8 by addition of sulfuric acid to form a dark colored colloidal suspension of palladium sulfide containing $1.126 \times 10^{-4}$ moles of palladium and $1 \times 10^{-4}$ moles of sulfur.

EXAMPLE 2

A copper clad epoxy board material having an array of through holes is prepared for plating by contact with a pretreatment solution identified as cleaner conditioner 231 available from Shipley Company Inc. and containing a proprietary amine surfactant and water rinsed. The cleaner conditioner cleans the copper and imparts a positive charge to the surface of the board. Treatment is by immersion for 5 minutes in the treatment solution maintained at about 45° C. The so treated board is then immersed in the palladium sulfide colloid formed by the process of Example 1. Treatment is for 5 minutes in the colloidal suspension maintained at a temperature varying between 25° and 30° C. Following treatment with the colloidal suspension of palladium sulfide, there is some darkening of copper indicating the formation of copper sulfide. This is removed by immersion of the substrate in a peroxide sulfuric etchant identified as Pre-etch 746 etchant for 30 to 60 seconds at room temperature. Thereafter, the part is water rinsed and electroplated from an acid copper electroplating bath identified as Electroposit ® 892 acid copper at a current density of 15 amps/sq. ft. and at a temperature of 70° F. for three minutes. Complete coverage with electrolytic copper occurs after only 3 minutes though the longer plating time was used to permit deposition of an adequately thick layer of copper.

Examples 1 and 2 constitute the currently preferred embodiment of the invention.

EXAMPLE 3

This example utilizes a commercially available copper colloid identified as Roncat and available from Lea Ronal. It is believed that this catalyst is a copper colloid containing a small amount of palladium. A solution is prepared by mixing 80 ml of the Roncat copper colloid catalyst with 1 ml of 0.1 molar sodium borohydride to reduce any oxidized copper within the catalyst. This solution is then mixed with 3 ml of a 1 molar sodium sulfide solution with pH adjustors to approximately 8.5. Thereafter, the procedure of Example 2 is repeated substituting the copper sulfide colloid formed by the process of this example for the palladium sulfide colloid used in Example 2. Within 60 minutes of electroplating, all the holes are completely plated.

I claim:

1. A printed circuit board having metallized through holes providing electrical contact from one side of the board to the other, said metallized through holes consisting essentially of electroplated copper on the walls of the holes and having an adsorbed layer of colloidal particles of a catalytic metal sulfide disposed between the circuit board base material and the copper on the walls of the through holes.

2. The circuit board of claim 1 where the catalytic metal is a noble metal.

3. The circuit board of claim 2 where the noble metal is palladium.

4. The circuit board of claim 1 where the catalytic metal is copper.

* * * * *

UNITED STATES PATENT AND TRADEMARK OFFICE
CERTIFICATE OF CORRECTION

PATENT NO. : 5,276,290
DATED : January 4, 1994
INVENTOR(S) : John J. Bladon

It is certified that error appears in the above-indentified patent and that said Letters Patent is hereby corrected as shown below:

Column 10

In Example 1, line 8, delte "aminosulfonic" and substitute --amino methane sulfonic--.

Signed and Sealed this

Fourteenth Day of June, 1994

Attest:

BRUCE LEHMAN

Attesting Officer

Commissioner of Patents and Trademarks